(12) United States Patent
Lim et al.

(10) Patent No.: US 8,627,835 B2
(45) Date of Patent: Jan. 14, 2014

(54) IN-SITU CLEANING ASSEMBLY

(75) Inventors: Gregory Lim, Fremont, CA (US);
Aaron Francis, San Jose, CA (US);
Kenneth Williams, Livermore, CA (US)

(73) Assignee: Intermolecular, Inc., San Jose, CA (US)

( * ) Notice: Subject to any disclaimer, the term of this patent is extended or adjusted under 35 U.S.C. 154(b) by 356 days.

(21) Appl. No.: 13/086,327

(22) Filed: Apr. 13, 2011

(65) Prior Publication Data

US 2012/0260953 A1    Oct. 18, 2012

(51) Int. Cl.
*B08B 3/00* (2006.01)

(52) U.S. Cl.
USPC ........... 134/172; 134/137; 134/149; 134/151; 134/177

(58) Field of Classification Search
CPC .................................................. H01L 21/67126
USPC ......................... 134/137, 172, 177
See application file for complete search history.

(56) References Cited

U.S. PATENT DOCUMENTS

| | | | |
|---|---|---|---|
| 3,265,080 A | 8/1966 | De Young et al. | |
| 4,477,287 A | 10/1984 | Kush et al. | |
| 4,622,988 A | 11/1986 | Takimoto et al. | |
| 5,232,156 A * | 8/1993 | Csordas et al. | 239/117 |
| 5,252,132 A * | 10/1993 | Oda et al. | 118/725 |
| 5,522,660 A | 6/1996 | O'Dougherty et al. | |
| 5,590,695 A | 1/1997 | Siegele et al. | |
| 5,603,351 A | 2/1997 | Cherukuri et al. | |
| 5,891,257 A * | 4/1999 | Stephanie et al. | 134/5 |
| 6,168,048 B1 | 1/2001 | Xu et al. | |
| 6,616,772 B2 | 9/2003 | de Larios et al. | |
| 6,837,967 B1 | 1/2005 | Berman et al. | |
| 2004/0140203 A1 | 7/2004 | Burkhart et al. | |
| 2007/0199510 A1 * | 8/2007 | Weiner et al. | 118/719 |
| 2007/0267631 A1 * | 11/2007 | Weiner et al. | 257/48 |
| 2008/0225248 A1 | 9/2008 | Poon et al. | |
| 2011/0122196 A1 * | 5/2011 | Hill | 347/47 |

OTHER PUBLICATIONS

Modular Platform for High-Throughput Formulation of Highly Viscous Fluids and Powders; Flamac VZW; http://www.flamac.be/wp-content/uploads/2010/01/vf_hte_en1.pdf.
High-Throughput Formulation, Application and Screening of High Viscous Solutions / Dispersions / Pastes (SDP); Flamac VZW; http://www.flamac.be/wp-content/uploads/2010/01/sdp_introduction2.pdf.

* cited by examiner

*Primary Examiner* — Michael Kornakov
*Assistant Examiner* — Marc Lorenzi

(57) ABSTRACT

A cleaning chamber is provided. The cleaning chamber includes a base portion housing a chuck and a lid affixed to the base portion. A support assembly is linked to the lid and the support assembly includes a top plate spaced apart from a bottom plate, the top plate has a plurality of openings defined therethrough and the bottom plate has a plurality of openings defined therethrough. The cleaning chamber includes a plurality of cups extending through corresponding pairs of the plurality of openings of the top plate and the bottom plate. The plurality of cups is configured to seal against a surface of a substrate, wherein each cup of the plurality of cups is independently supported by the bottom plate.

5 Claims, 13 Drawing Sheets

IN-SITU CLEANING ASSEMBLY

BACKGROUND

Combinatorial processing of substrates performs processing on several regions of a substrate differently. The areas surrounding these regions are not processed as the regions are isolated during the processing. More than half of the substrate's surface may be unprocessed. It may be desirable to take the substrate processed in a combinatorial processing chamber and reinsert it into a conventional processing chamber to complete the formation of a structure or device for subsequent testing, screening or characterization. The unprocessed areas may preclude the substrate from being reinserted into a conventional substrate processing line, as the mask material, or any other contaminant, on the unprocessed areas remains. The mask material or other contaminants could contaminate a conventional processing chamber unless the material is removed from the unprocessed areas of the substrate. The additional processing afforded by reinserting the substrate into a conventional processing chamber may be required before a process from the combinatorial processing chamber and the resulting substrate can be characterized. Accordingly, if the substrate could be reinserted into the conventional processing line, the substrate could undergo further processing in order to evaluate the combinatorial processing.

It is within this context that the current embodiments arise.

SUMMARY

Embodiments of the present invention provide a cleaning assembly that enables cleaning of the unprocessed regions of the substrate in order to enable insertion of the substrate into a semiconductor processing line in order to be able to characterize the substrate and the combinatorial processing.

In one aspect of the invention, a cleaning chamber is provided. The cleaning chamber includes a base portion housing a chuck and a lid affixed to the base portion. A support assembly is linked to the lid and the support assembly includes a top plate spaced apart from a bottom plate, the top plate has a plurality of openings defined therethrough and the bottom plate has a plurality of openings defined therethrough. The cleaning chamber includes a plurality of cups extending through corresponding pairs of the plurality of openings of the top plate and the bottom plate. The plurality of cups are configured to seal against a surface of a substrate, wherein each cup of the plurality of cups is independently supported by the bottom plate.

In another aspect of the invention, a method for cleaning a substrate having a plurality of regions defined thereon is provided. The method includes combinatorially processing the substrate where different site isolated regions are processed differently. Each of the site isolated regions are isolated and the substrate is submerged in a cleaning fluid thereby cleaning areas of the substrate external to the site isolated regions. The cleaning fluid is removed and each of the site isolated regions is exposed. The substrate is processed in a full wafer cleaning tool.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

Figure 1A:
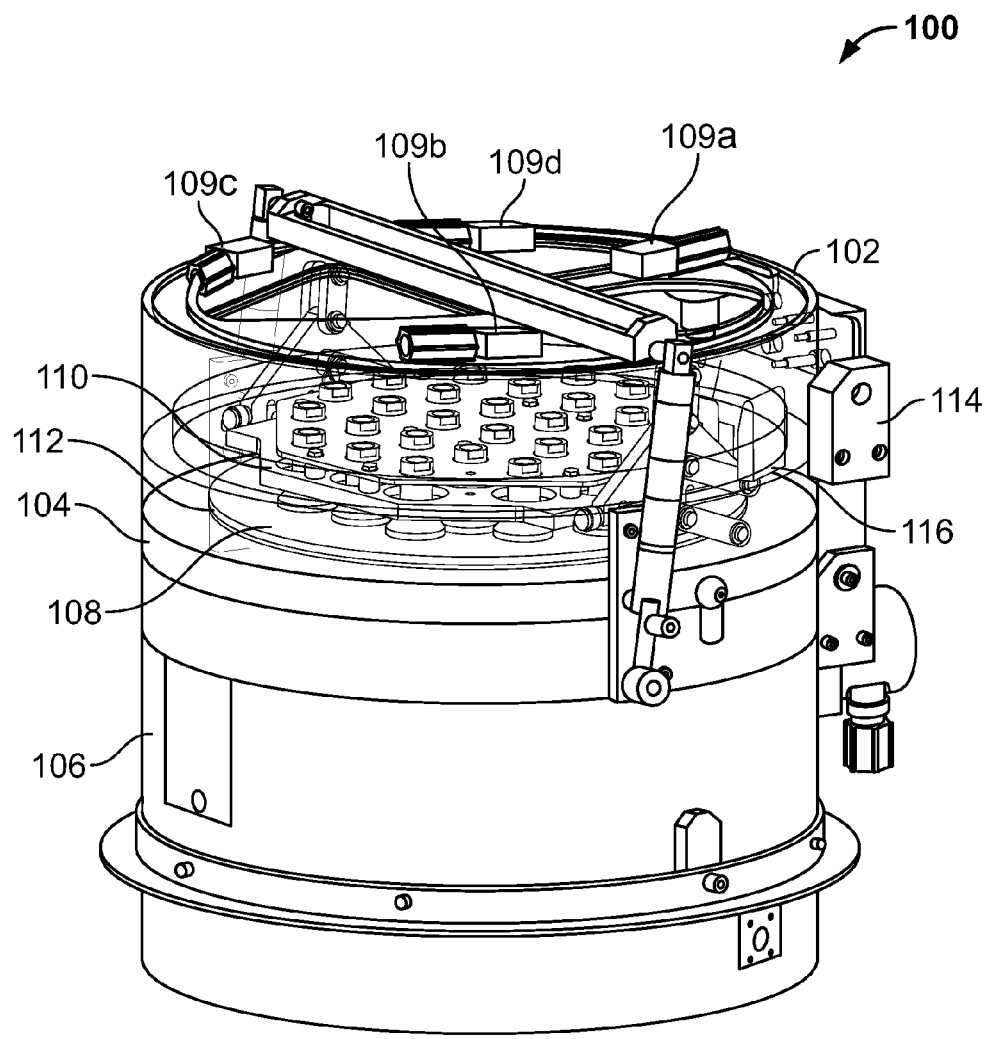
FIG. 1A is a simplified schematic diagram illustrating a perspective view of a multi module cleaning chamber in accordance with one embodiment of the invention.

The embodiments described herein provide a method and apparatus for cleaning unprocessed regions of a combinatorially processed substrate (i.e. a substrate that has different isolated regions of the substrate processed differently). It will be obvious, however, to one skilled in the art, that the present invention may be practiced without some or all of these specific details. In other instances, well known process operations have not been described in detail in order not to unnecessarily obscure the present invention.

The embodiments described herein provide for an in-situ cleaning assembly that isolates combinatorially processed regions while supporting the substrate. A substrate is delivered to the in-situ cleaning assembly and the processed regions of the substrate are isolated. The cleaning solution has access to all of the unprocessed regions of the substrate, while the cups providing the support of the substrate isolates the regions of the substrate that have been combinatorially processed. As a result, the unprocessed region, which may have a mask material or other contaminants disposed thereon, is cleaned so that the entire substrate may be introduced into a semiconductor tool, such as a deposition tool, etch tool, etc.

The embodiments described herein enable the application of combinatorial techniques to process sequence integration in order to arrive at a globally optimal sequence of the manufacturing operations by considering interaction effects between the unit manufacturing operations, the process conditions used to effect such unit manufacturing operations, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further below analyze a portion or sub-set of the overall process sequence used to manufacture a semiconductor device. Once the subset of the process sequence is identified for analysis, combinatorial process sequence integration testing is performed to optimize the materials, unit processes and process sequence used to build that portion of the device or structure. During the processing of some embodiments described herein, structures are formed on the processed semiconductor substrate, which are equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, or process sequences) and not the lack of process uniformity.

FIG. 1A is a simplified schematic diagram illustrating a perspective view of a multi module cleaning chamber in accordance with one embodiment of the invention. Lid 102 is illustrated in a closed position for processing in this exemplary embodiment. Cleaning chamber 100 includes a top cleaning module disposed over a bottom cleaning module. The top cleaning module includes lid 102 disposed over mid portion 104. It should be appreciated that mid portion 104 functions as a base for the top cleaning module and a lid for the bottom cleaning module. Base 106 encloses a spin rinse dry (SRD) module in one embodiment. The top cleaning module functions as an in situ cleaning assembly in accordance with one embodiment. Lid 102 is hinged to mid portion 104. Support assembly 110 is linked to lid 102 and supports substrate 108. Substrate 108 is supported by a plurality of cups that isolate site-isolated regions of substrate 108. In this manner the regions external to the site-isolated regions of substrate 108 may be cleaned while the site-isolated regions are protected. Disposed on a top surface of lid 102 are manifolds 109a-c. Manifolds 109a-c provide either vacuum or pressurized gas to the plurality of cups in order to isolate regions of the substrate 108 during processing, as will be described in further detail below. In one embodiment, manifolds 109b and 109c provide pressurized gas to corresponding cups that are not involved in the vacuum transport of the substrate to and from the end effector, while manifold 109a provides both pressurized gas and vacuum to the cups involved in the transportation of the substrate to and from the end effector as discussed with reference to FIG. 6C. Tee fitting 109d provides a coupling to both of manifolds 109b and 109c. The above configuration is exemplary and not meant to be limiting as alternative gas and vacuum distribution configurations may be incorporated. Hinge 114 provides the ability to open and close lid 102, along with the support cylinder attached to a side of lid 102 and to a side of mid portion 104. Fitting 116 provides the ability to flow fluid or drain fluid from the chamber of the top cleaning module.

Figure 1B:
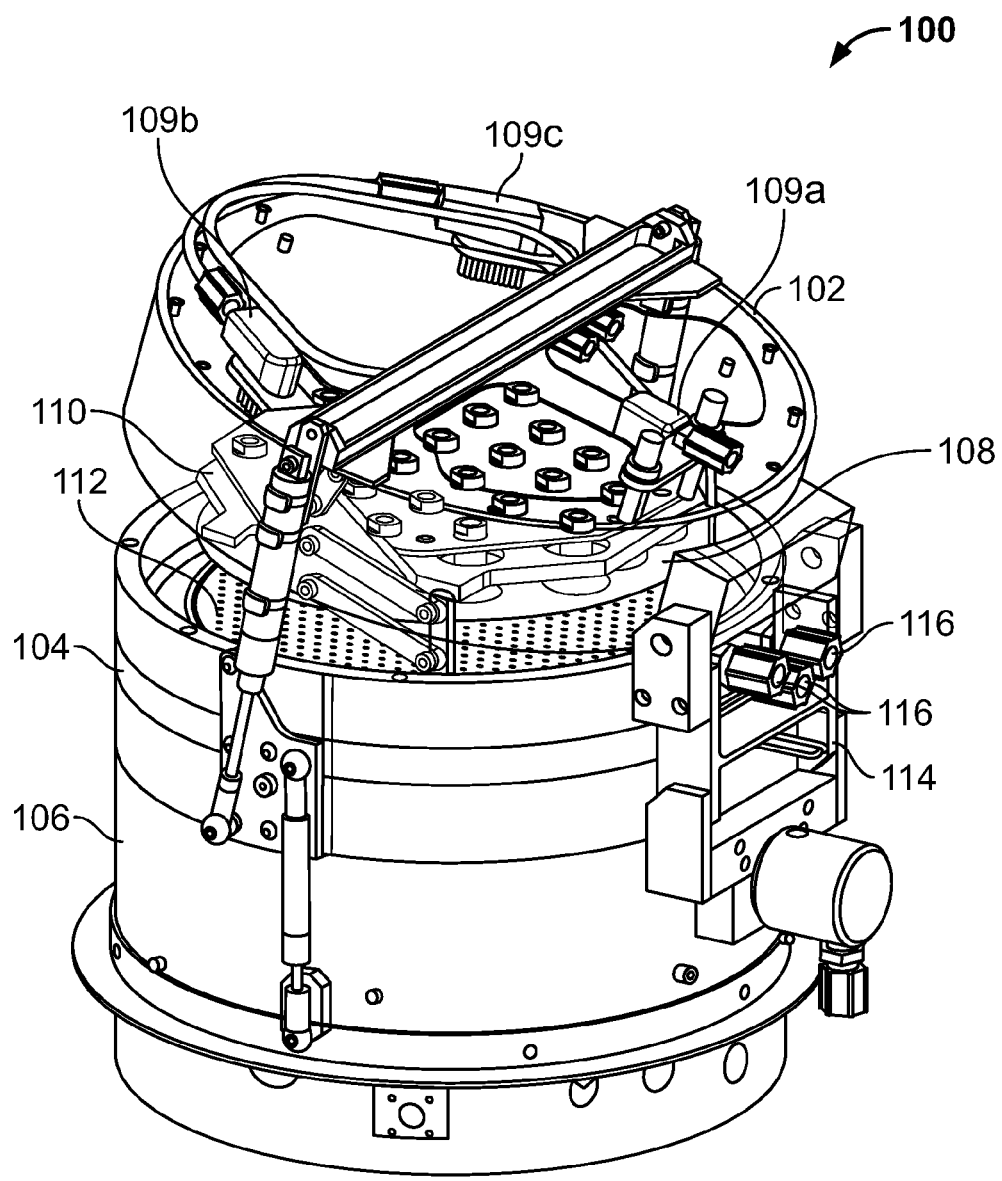
FIG. 1B is a simplified schematic diagram illustrating a perspective view of a multi module cleaning chamber of FIG. 1A with the lid in an open position in accordance with one embodiment of the invention.

FIG. 1B is a simplified schematic diagram illustrating a perspective view of a multi module cleaning chamber of FIG. 1A with the lid in an open position in accordance with one embodiment of the invention. Lid 102 in an open position enables an end effector access to the top cleaning module in order to transport substrate 108 to and from the top cleaning module of cleaning chamber 100. The substrate is supported by a subset of the cups through vacuum provided by manifold 109a as will be described in more detail below and as illustrated in FIG. 6C.

Figure 2:
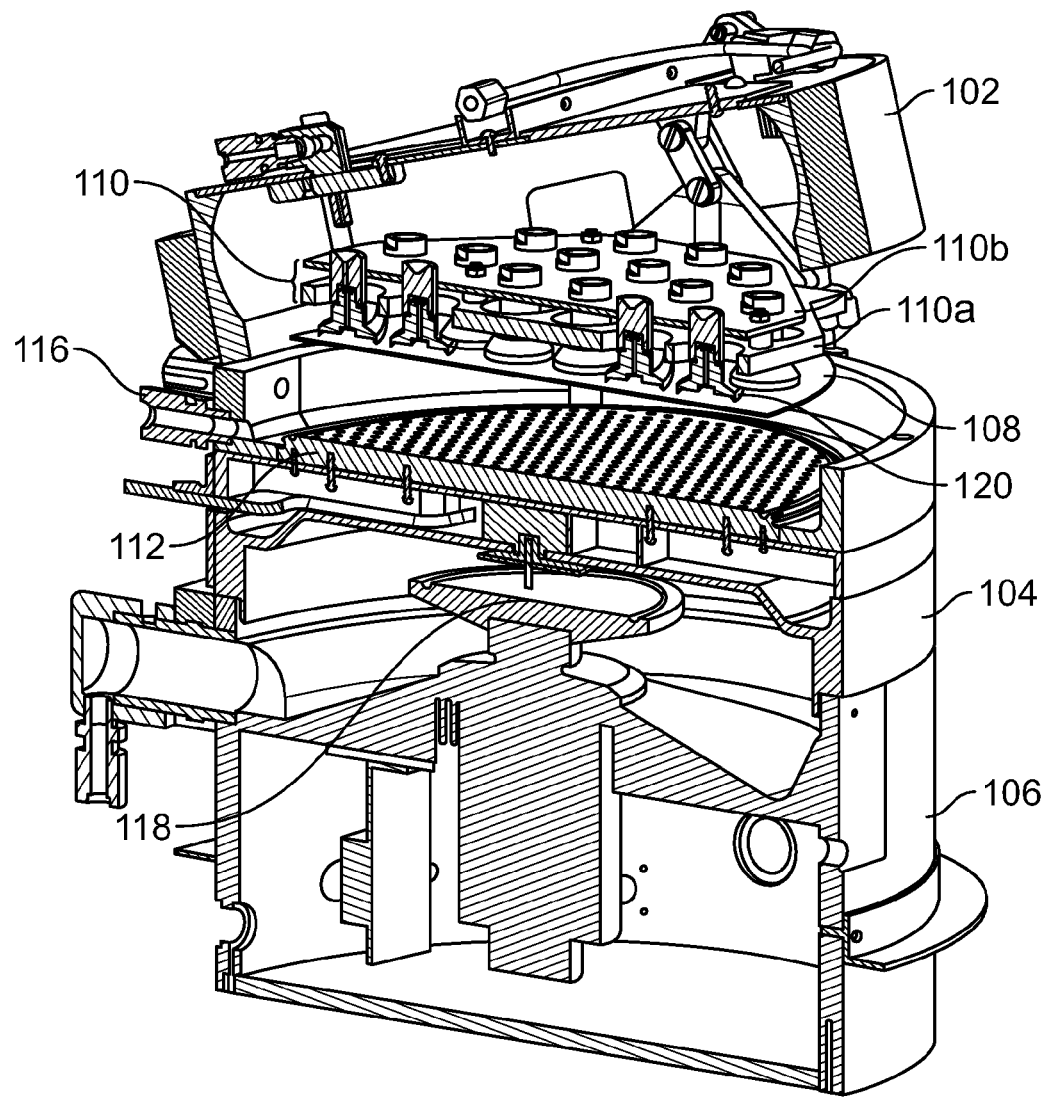
FIG. 2 is a simplified schematic diagram illustrating a cross-sectional view of a multi-module cleaning chamber in accordance with one embodiment of the invention.

FIG. 2 is a simplified schematic diagram illustrating a cross-sectional view of a multi-module cleaning chamber in accordance with one embodiment of the invention. Lid 102 houses or encompasses top and side surfaces of support assembly 110 when the lid is in a closed position. Support assembly 110 includes top plate 110b disposed over bottom plate 110a. Top plate 110b has a plurality of holes disposed thereon. Cups 120 are disposed through the plurality of holes within top plate 110b and a plurality of holes in top plate 110a that are substantially aligned with corresponding holes of the bottom plate. Substrate 108 is supported through cups 120, as will be described in more detail below. When lid 102 is in a closed position a bottom surface of substrate 108 will rest against chuck 112. Fitting 116 enables fluid flow to exit from the top cleaning module in one embodiment. As illustrated in FIG. 2 mid portion 104 functions as a bottom portion to the top cleaning module and a top portion of the bottom cleaning module. The bottom cleaning module, which includes base 106, functions as an SRD module in one embodiment. The SRD module includes chuck 118 that supports and spins a substrate during a cleaning operation. It should be appreciated that the bottom cleaning module may be an SRD unit known in the art in one embodiment. It should be appreciated that the material of construction for support assembly 110, cups 120, chuck 112, and chuck 118 may be any suitable material compatible with the cleaning fluids and operations, such as plastic, e.g., a fluoropolymer in one embodiment. In one embodiment, the chucks, linkages, covers and plates described herein are composed of Ethylene chlorotrifluoroethylene (ECTFE), the tubing is composed of Perfluoroalkoxy (PFA) PTFE: the basins and lid are composed of polytetrafluoroethylene (PTFE), and the o-rings are composed of a Perfluorinated Elastomer (FFKM).

Figure 3:
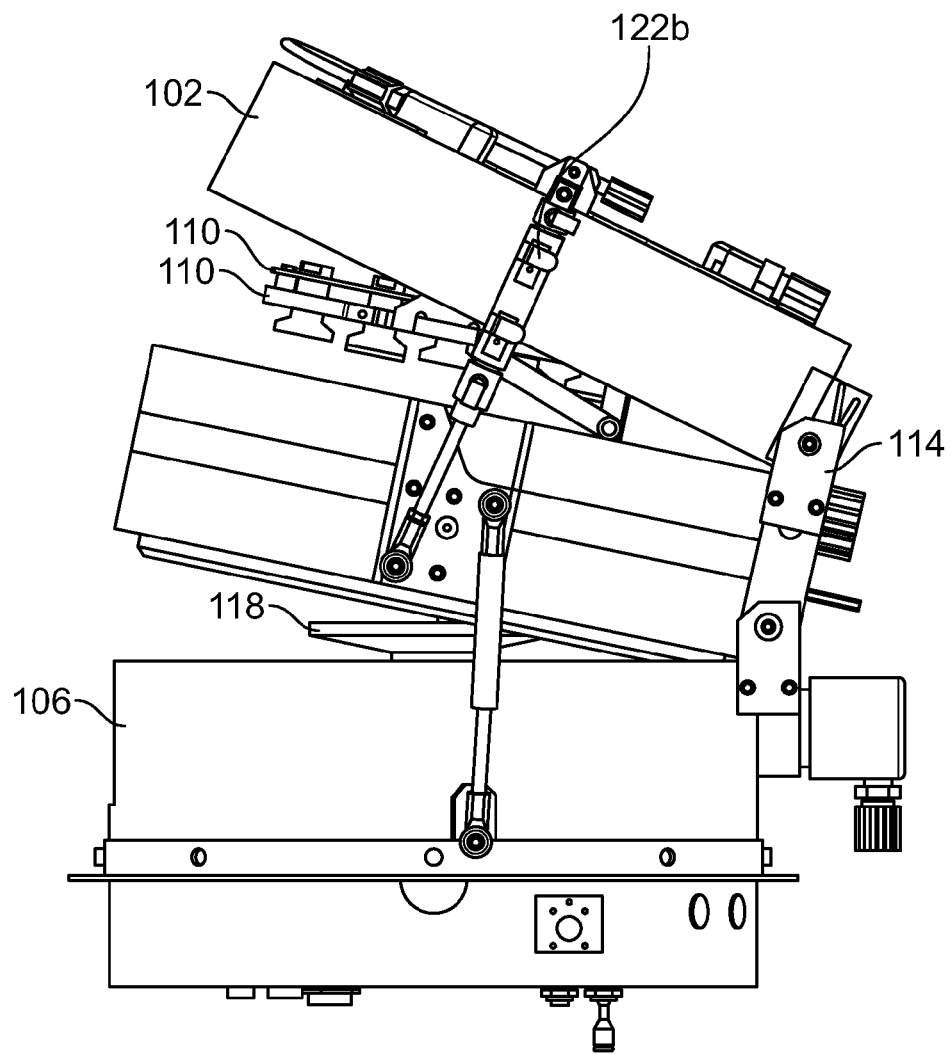
FIG. 3 is a simplified schematic diagram illustrating a perspective view of the cleaning chamber with top cleaning module and the bottom cleaning module in an open position in accordance with one embodiment of the invention.

FIG. 3 is a simplified schematic diagram illustrating a perspective view of the cleaning chamber with top cleaning module and the bottom cleaning module in an open position in accordance with one embodiment of the invention. Lid 102 is in an open position through the support of hinge 114 and support cylinder 122b. In the open position, the top cleaning module enables access for a substrate to be delivered so that support assembly 110 may couple to the substrate. In one embodiment, an end effector may be used to transport a substrate to and from the cleaning module. Mid portion 104 is also opened enabling access to the bottom cleaning module. Hinge 114 and support cylinder 122a provide the support and force necessary for opening or lifting mid portion 104. In an open position bottom cleaning module enables access for a substrate to be placed on chuck 118. It should be appreciated that one exemplary operation may include isolating the combinatorially processed regions of a substrate in the top cleaning module and cleaning the external areas of the substrate in the top cleaning module. After the cleaning operation in the top cleaning module the substrate is transported to the bottom cleaning module for a SRD operation.

Figure 4:
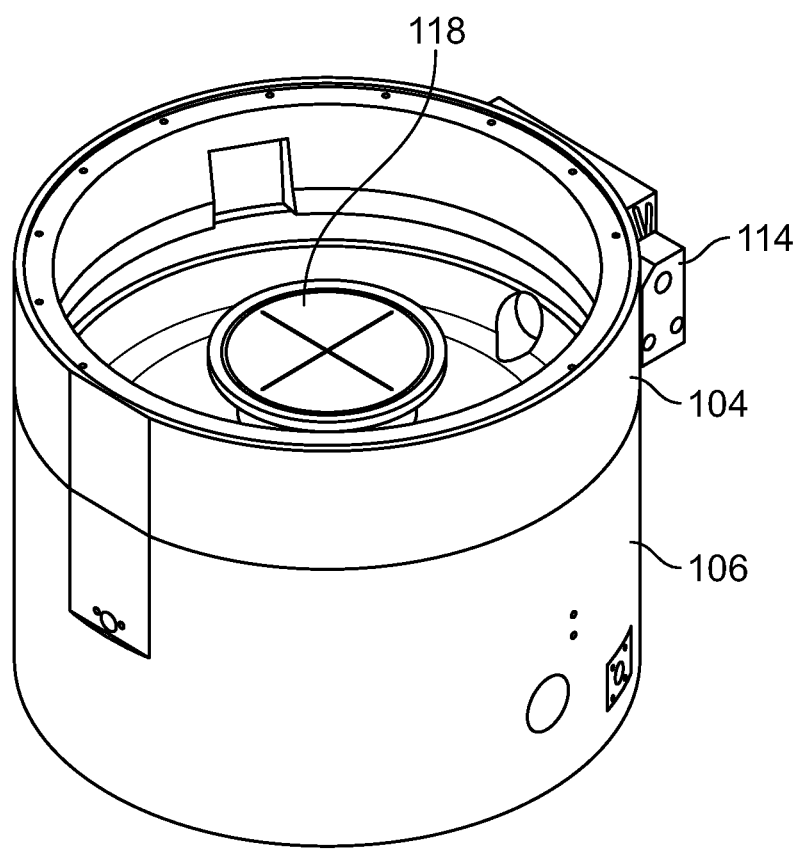
FIG. 4 is a simplified schematic diagram illustrating a perspective view of the bottom cleaning module in accordance with one embodiment of the invention.

FIG. 4 is a simplified schematic diagram illustrating a perspective view of the bottom cleaning module in accordance with one embodiment of the invention. Base 106 and mid portion 104 of the bottom cleaning module are coupled to each other through hinge 114. Within the bottom cleaning module, chuck 118 resides in order to support a bottom surface of a substrate for a cleaning operation, such as a spin rinse and dry operation. Fluid may be applied through a suitable fluid delivery system in one embodiment. Drains are provided within base 106 in order to allow fluid to exit.

Figure 5A:
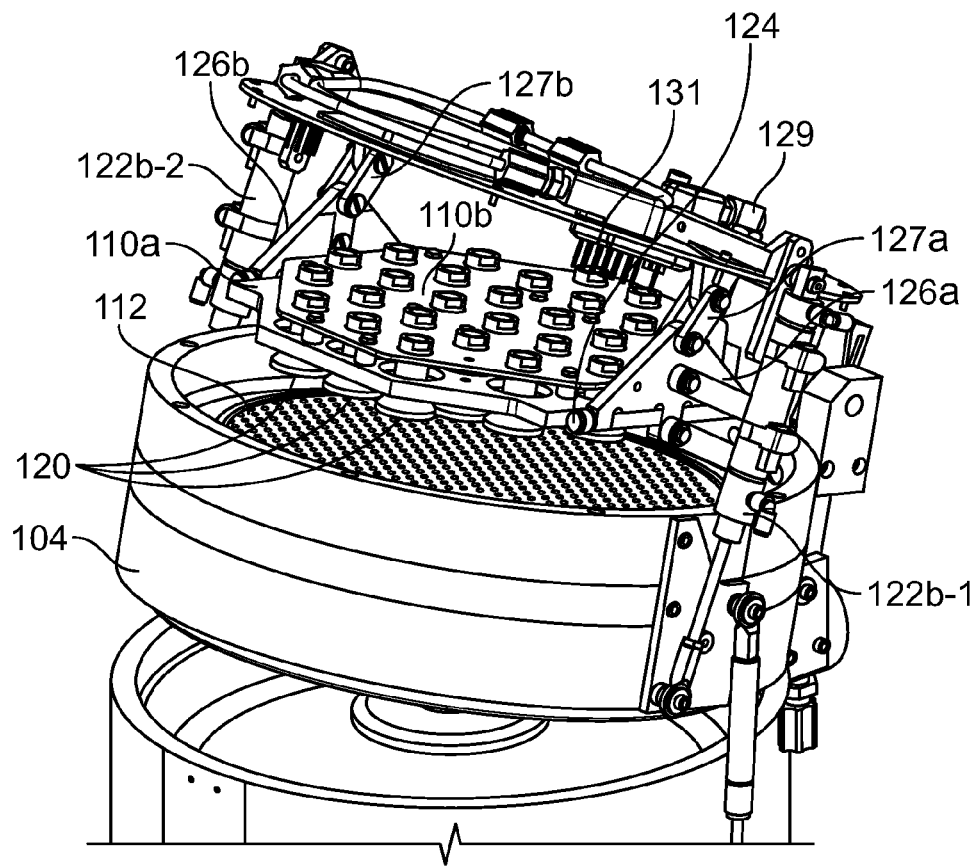
FIG. 5A is a simplified schematic diagram illustrating further details of the top cleaning module in accordance with one embodiment of the invention.

FIG. 5A is a simplified schematic diagram illustrating further details of the top cleaning module in accordance with one embodiment of the invention. In the exemplary embodiment of FIG. 5A the lid is made transparent in order to illustrate the details of the top cleaning module. Support assembly 110 is attached to the lid through linkages 126a, 126b 127a and 127b. It should be appreciated that linkages 126a and 126b provide for a substrate being supported through cups 120 to be inclined at a slight angle relative to the surface of chuck 112 in one embodiment. Level adjusters 129 are used to correct or adjust the level of the substrate from the inclined position to a flat position in order to facilitate the transfer to and from an end effector transporting the substrate. Pin 124 enables the removal of support assembly 110 so that different support assemblies having different configurations may be switched into and out of the top cleaning module. For example, support assemblies having different numbers of cups and shapes of cups may be substituted. Vacuum lines 131 provide a connection from the vacuum manifolds to a top portion of cups 120. As will be illustrated further below cups 120 include a centrally located channel from a top portion of the cups to a bottom surface of the bottom portion of the cups so that pressurized gas or vacuum may be applied through the cup to isolate the areas of the substrate.

Figure 5B:
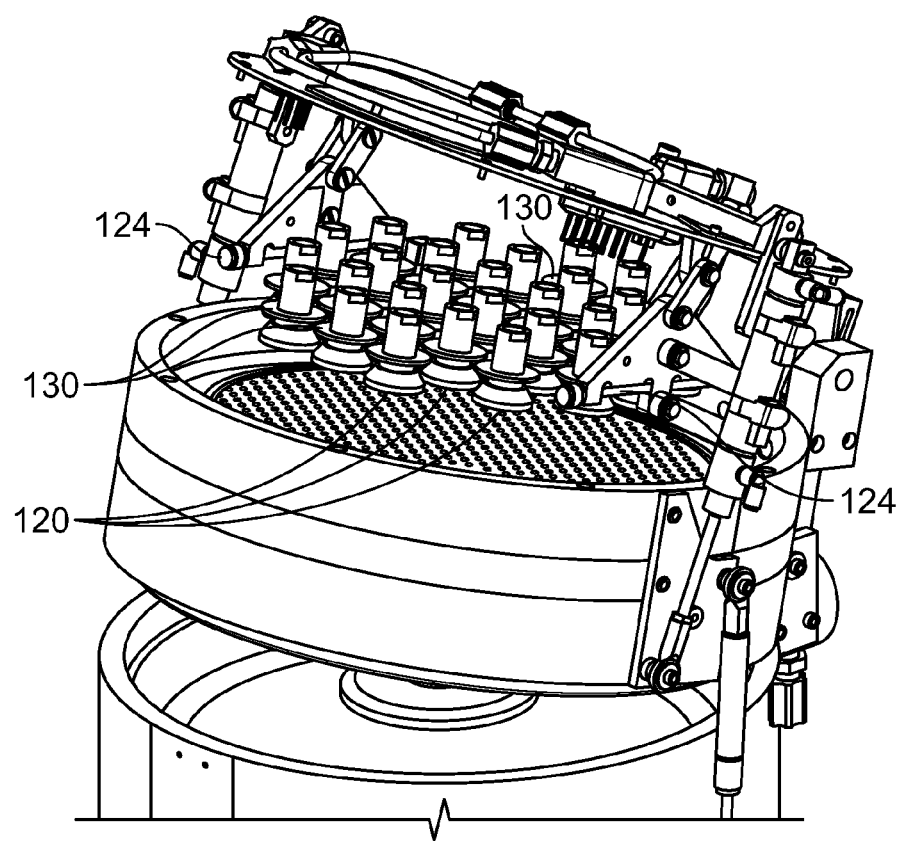
FIG. 5B is a simplified schematic diagram illustrating the top cleaning module of FIG. 5A with the support assembly made transparent in order to illustrate further details of the top cleaning module in accordance with one embodiment of the invention.

FIG. 5B is a simplified schematic diagram illustrating the top cleaning module of FIG. 5A with the support assembly made transparent in order to illustrate further details of the top cleaning module in accordance with one embodiment of the invention. Cups 120 are each supported independently through discs 130 disposed within the holes defined within the bottom plate. Discs 130 are configured so that cups 120 may deflect in 3 dimensions. However, due to the support of the top portion of cups 120 the deflection is limited in a vertical direction. Further details on discs 130 are provided below.

Figure 6A:
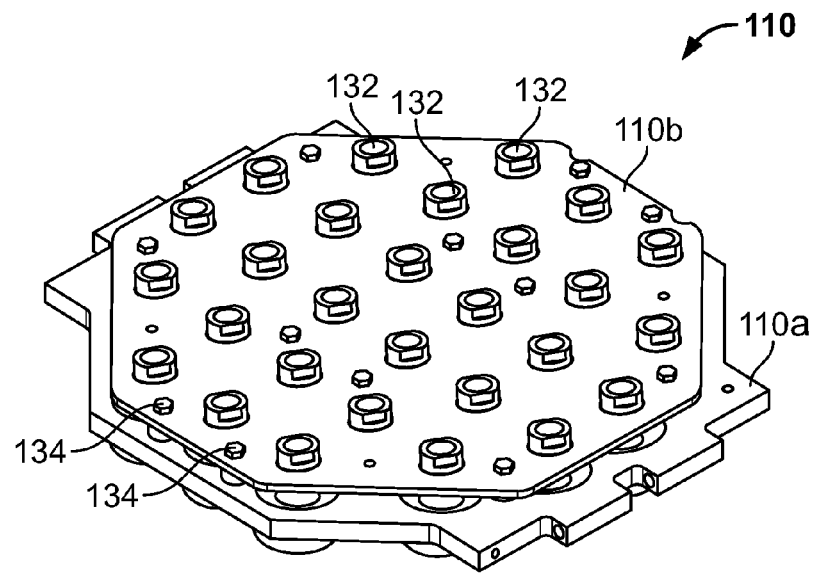
FIGS. 6A through 6C are simplified schematic diagram illustrating various views of the support assembly in accordance with one embodiment of the invention.
Figure 6B:
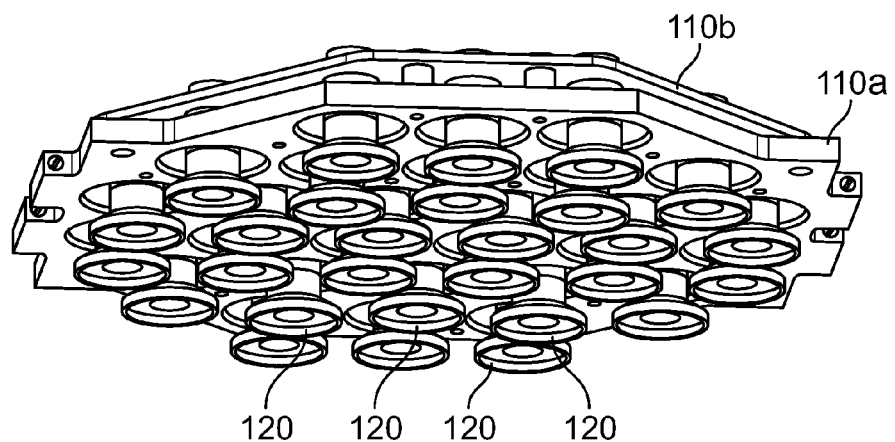
Figure 6C:
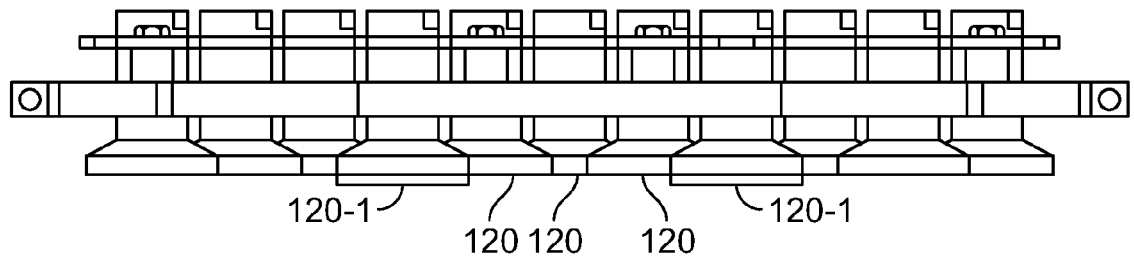

FIGS. 6A through 6C are simplified schematic diagram illustrating various views of the support assembly in accordance with one embodiment of the invention. Support assembly 110 of FIG. 6A includes top plate 110b and bottom plate 110a. In one embodiment, the coupling of top plate 110b and bottom plate 10a form a truss to provide rigidity to the overall structure. Openings 132 are configured to receive the gas/vacuum lines and are connected to a top portion of cups 120. Top plate 110b is affixed to bottom plate 110a through any known means, such as bolts 134. In FIG. 6B a bottom view illustrating further details of cups 120 is provided. Cups 120 are configured to isolate regions of the substrate so that the external regions outside of the isolated regions, i.e., outside of cups 120, may be cleaned. As mentioned above, support assembly 110 may be replaced with relative ease as the support pin 124 of FIGS. 5A and 5B running through the extensions of bottom plate 110a may be removed in order to remove the support assembly. It should be noted that in one embodiment, a square/rectangular opening is provided on the bottom surface of the lower portion of cups 120 to enable insertion/attachment of the lower portion with the upper body of cups 120 without the need for a person to physically touch the lower body of cups 120. That is, a tool that mates with the rectangular opening can be utilized to insert the lower portion with the upper body in one embodiment. As illustrated in FIG. 6C, cups 120 may be disposed at different distances from a bottom surface of bottom plate 110a. That is, cups 120-1 may be disposed further below the remaining portion of cups 120. In this manner, a substrate may be initially supported through a first portion of the cups, i.e., cups 120-1 extending farthest away from the bottom surface of bottom plate 110a. For example, a substrate being introduced into the cleaning module may be contacted through the first portion of cups 120-1, and vacuum may be pulled through one of the vacuum manifolds in order to provide support of the substrate so that the substrate may be removed from the transport mechanism. In one embodiment, four cups connected to a manifold provide the initial support of the substrate. Once the substrate is removed from the transport mechanism the lid may close and the substrate placed onto the chuck of the top cleaning portion. At this point the remaining portion of cups 120 may be sealed against the corresponding site isolated regions of the top surface of the substrate in order for the cleaning process to be initiated. The remaining portion of the cups is coupled to the remaining two-manifolds of FIG. 1.

In one embodiment, the assembly "masks" the regions through the following process. An end effector delivers a substrate underneath the support assembly of the cleaning module and then in raised so that a portion of the cups contact the surface of the substrate. In one embodiment, four cups initially contact the surface of the substrate and vacuum is applied through these four cups in order to transport the substrate to and from the end effector as discussed with regard to FIG. 6C. The vacuum suction against the substrate surface is confirmed for a portion of the four cups, e.g., at least two cups, prior to transporting the substrate. In one embodiment, a pressure gauge indicating the amount of vacuum within the line supplying vacuum to the four cups indicates the amount of cups vacuum sealed with the surface of the substrate. The end effector is retracted and the lid is closed, which transports the substrate to the chuck of the cleaning module where the vacuum to the cups is terminated and vacuum is applied through the chuck to hold the substrate. The remaining cups, as well as the four transport cups, are then caused to contact the surface of the substrate and the isolation of the regions on the substrate is achieved by pressurizing the interior volume of all of the cups in order to prevent chemicals entering the isolated areas. In one embodiment, a pressure of about two pounds per square inch is applied to the interior of each cup as the outer edge of the cup is against the surface of the substrate. One exemplary inert gas utilized to supply the pressure is nitrogen. Cleaning fluid is then introduced into the module and the external areas to the regions are cleaned.

Figure 7:
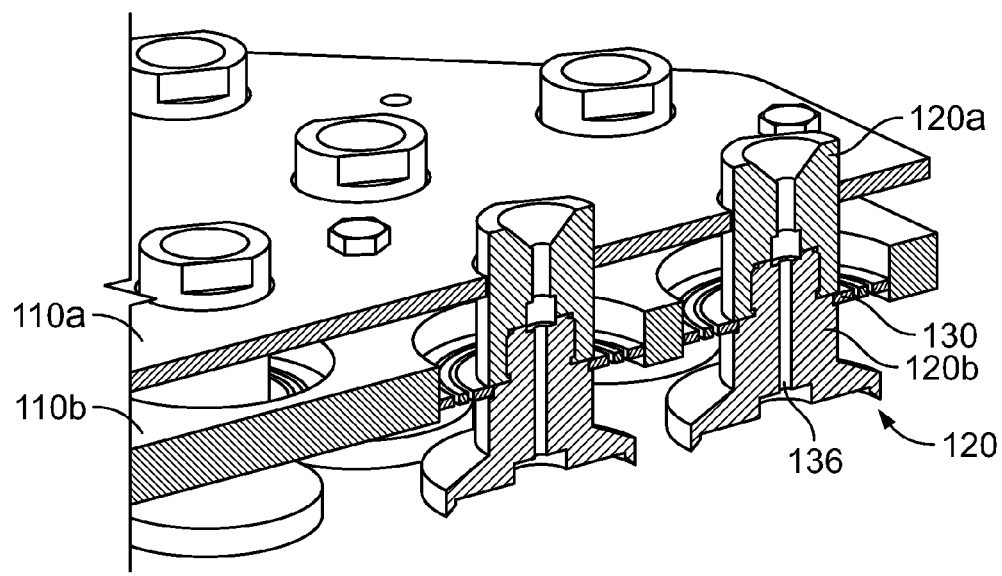
FIGS. 7 and 8 are simplified schematic diagrams illustrating further details of the cups in accordance with one embodiment of the invention.
Figure 8:
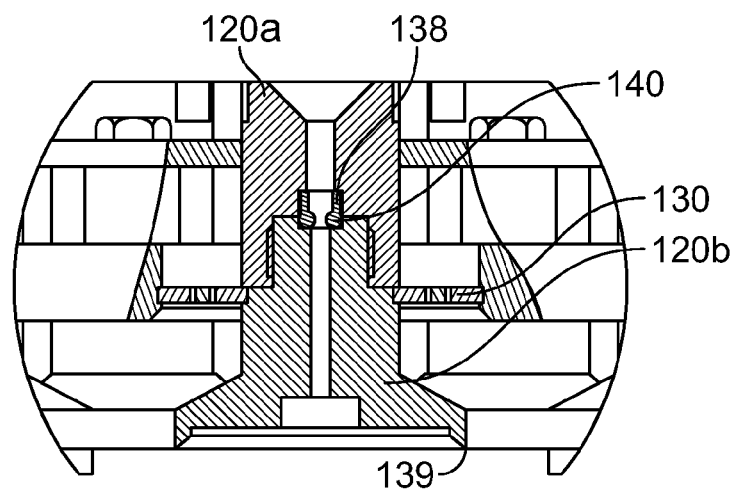
Figure 9:
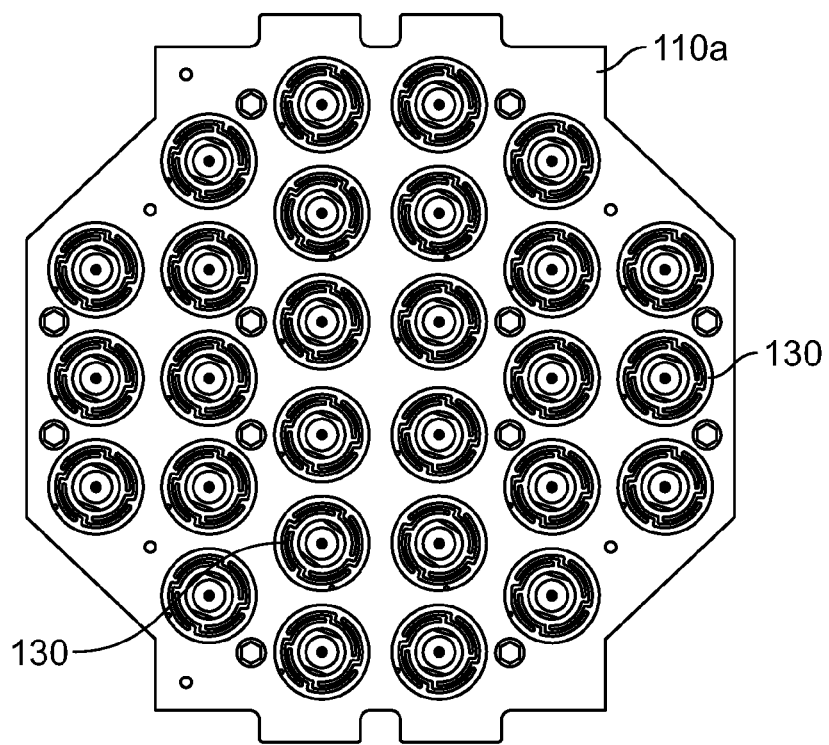
FIG. 9 is a simplified schematic diagram illustrating a bottom view of the support assembly in accordance with one embodiment of the invention.

FIGS. 7 and 8 are simplified schematic diagrams illustrating further details of the cups in accordance with one embodiment of the invention. Cups 120 are configured as having a top portion 120a and a bottom portion 120b. It should be appreciated that top portion 120a may be affixed to bottom portion 120b through any known means. Channel 136 extends from an opening of the top portion 120a to a bottom surface of the bottom portion 120b. A gas/vacuum supply line is affixed to the opening of top portion a in order to supply gas/vacuum to channel 136. Disc 130 flexibly supports cup 120. As mentioned above, cup 120 is allowed to deflect over a vertical length due to the flexible support provided by disc 130 and the guidance supplied by top plate 110b. The internal fitting within channel 136 defined between top portion 120a and bottom portion 120b may include a coupling 138 and o-ring 140. As illustrated in the exemplary embodiments of FIGS. 7 and 8 the bottom surface of cup 120 is configured so that a peripheral shoulder extension, also referred to as a peripheral circumferential extension surrounding a central portion of the bottom surface of the cups, extends along the outer surface of cup 120. Edge 139 along the outer periphery of the bottom surface of the cup seals the site isolated region of a substrate against which cup 120 is disposed. An inert gas, such as nitrogen is supplied through channel 136 to create the positive pressure within the cavity defined over the isolated region of the substrate in order to prevent any cleaning fluid from entering the cavity. FIG. 9 is a simplified schematic diagram illustrating a bottom view of the support assembly in accordance with one embodiment of the invention. In the exemplary embodiment of FIG. 9, discs 130 are disposed within a plurality of holes defined within bottom plate 110a. The cups are not illustrated in FIG. 9 in order to provide a clear illustration of discs 130. It should be further appreciated that while the configuration of the number of holes in the support assembly provides for the isolation of 28 regions on the substrate, alternative configurations may be utilized. That is, more or less holes may be provided on bottom plate 110a in order to support any configuration of site isolated regions on a substrate. Furthermore, it should be appreciated that the shape of the cups, while illustrated as circular in the exemplary embodiments, is not meant to be limited to a circular shape. As mentioned above, the support assembly is easily switched out as removal of pins from opposing sides enable ease of changeover.

Figure 10:
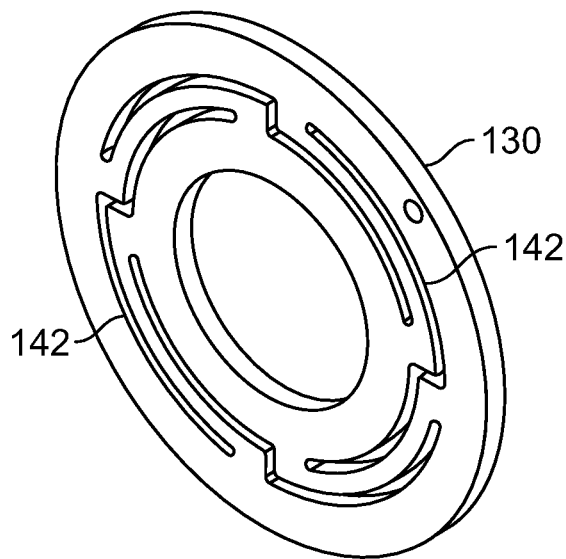
FIG. 10 is a simplified schematic diagram illustrating a perspective view of a disc in accordance with one embodiment of the invention.

FIG. 10 is a simplified schematic diagram illustrating a perspective view of a disc in accordance with one embodiment of the invention. Disc 130 includes a central opening through which a body of the cup extends. Disposed along disc 130 are arched openings or arcs 142. Arched openings 142 enable the deflection of disc 130 in order for a cup supported by disc 130 to have movement in 3 dimensions. The flexible support is provided to each cup independently. One skilled in the art will appreciate that other patterns of openings within disc 130 may provide the flexible support and as such the exemplary embodiments are not meant to be limiting. In one embodiment, disc 130 is composed of a flexible material that is compatible with the cleaning operations and materials utilized by the cleaning module. In another embodiment, disc 130 enables deflections of about +/−5 mm from a rest position for the supported cups.

Figure 11A:
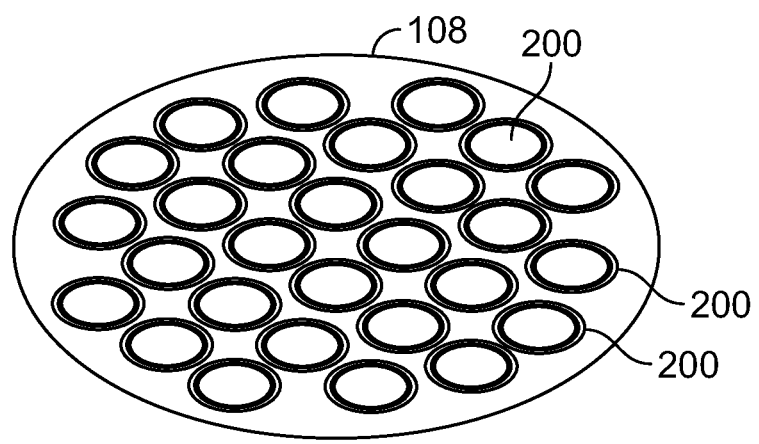
FIG. 11A is a simplified schematic diagram of a substrate that may be supported and processed with the cleaning assembly described herein in accordance with one embodiment of the invention.

FIG. 11A is a simplified schematic diagram of a substrate that may be supported and processed with the cleaning assembly described herein in accordance with one embodiment of the invention. Substrate 108 includes a plurality of regions 200 that are produced through the site isolated combinatorial processing referenced above. It should be appreciated that each region, or at least one region, may be processed differently through combinatorial processing tools of the assignee. The area outside of each region 200 is the region processed by the cleaning assembly described herein. That is, the cups of the cleaning assembly isolate the majority of the surface area of regions 200 so that the area outside of the regions can be cleaned in order to enable substrate 108 to be introduced to a semiconductor processing tool for any semiconductor processing operation.

Figure 11B:
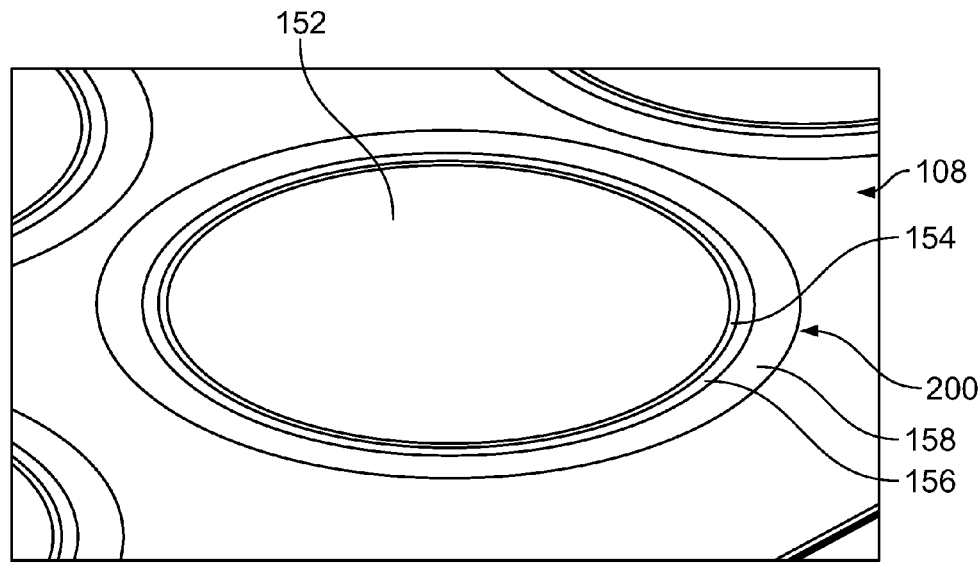
FIG. 11B is a simplified schematic diagram illustrating details on the isolation of the regions for the cleaning of the area outside of the regions in accordance with one embodiment of the invention.
Figure 11C:
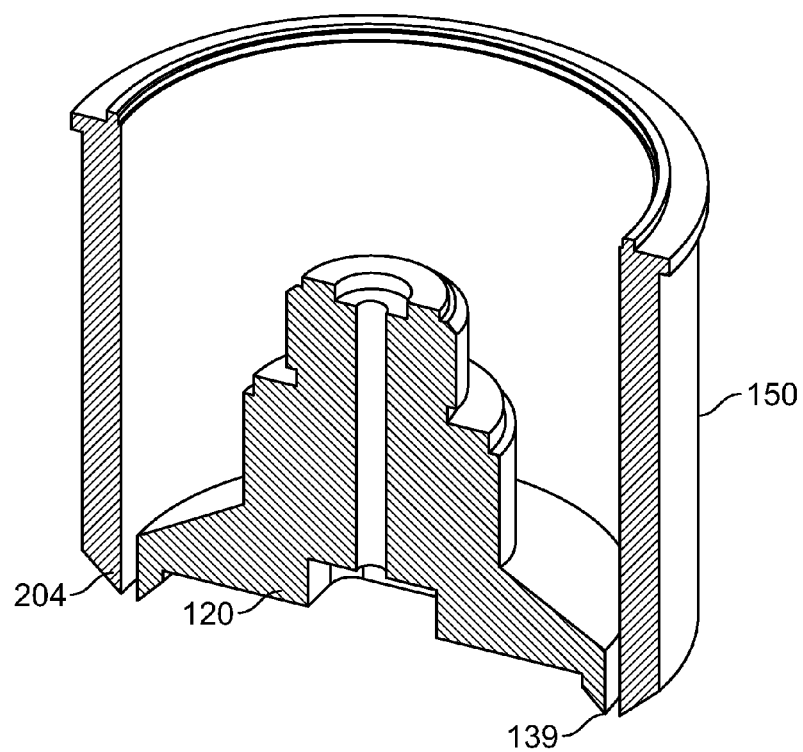
FIG. 11C is a simplified schematic diagram of a cross sectional view of the site isolated reactor sleeve and the cup that results in the configuration of the region of FIG. 11B in accordance with one embodiment of the invention.
Figure 11D:
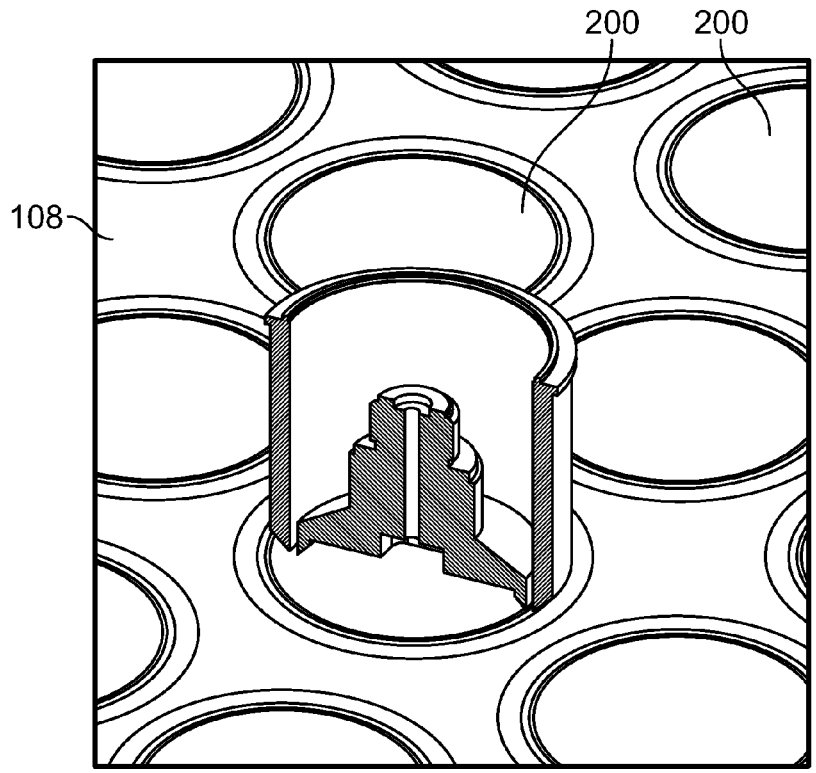
FIG. 11D is a simplified schematic diagram illustrating a cross sectional view of the site isolated reactor sleeve and cup disposed over a corresponding region of the substrate in accordance with one embodiment of the invention.

FIG. 11B is a simplified schematic diagram illustrating details on the isolation of the regions for the cleaning of the area outside of the regions in accordance with one embodiment of the invention. Region 200 of substrate 108 is illustrated having useable processing area 152 surrounded by cup edge region 154, double processed region 158 and reactor sleeve edge region 156. It should be appreciated that double processed region 158 is formed between the edge of the reactor sleeve and the edge of the cup. FIG. 11C is a simplified schematic diagram of a cross sectional view of the site isolated reactor sleeve and the cup that results in the configuration of region 200 of FIG. 11B in accordance with one embodiment of the invention. Edge 139 of cup 120 is illustrated inside of the internal area of reactor sleeve 150. Edge 204 of reactor sleeve 150 defines the outer boundary of the double processed region of FIG. 11B, while edge 139 of cup 120 defines the inner boundary of the double processed region. It should be appreciated that double processed region 158 is exposed to the combinatorial processing and the cleaning operation described herein. Edge 139 of cup 120 is a relatively thin lip knife edge at the bottom of the cup in one embodiment. Thus, as a force is applied to edge 139, a seal is formed between the bottom surface of the edge and the surface of a substrate thereby isolating the regions of the substrate. In addition, the positive pressure applied to the cavity defined by the cup prevents any cleaning fluid from entering over the useable processing area 152 of FIG. 11A. It should be appreciated that alternative configurations to the edge embodiment to provide the sealing surface may be integrated to the bottom of cups 120 as the embodiments described herein are exemplary. FIG. 11D is a simplified schematic diagram illustrating a cross sectional view of the site isolated reactor sleeve and cup disposed over a corresponding region of the substrate in accordance with one embodiment of the invention. It should be appreciated that alternative embodiments may be integrated into the cleaning module. For example, the cups may be replaced with a non-contact cup that incorporates a Bernoulli chuck. In addition, the flexures are optional and the cups may be fixed height cups.

Figure 12:
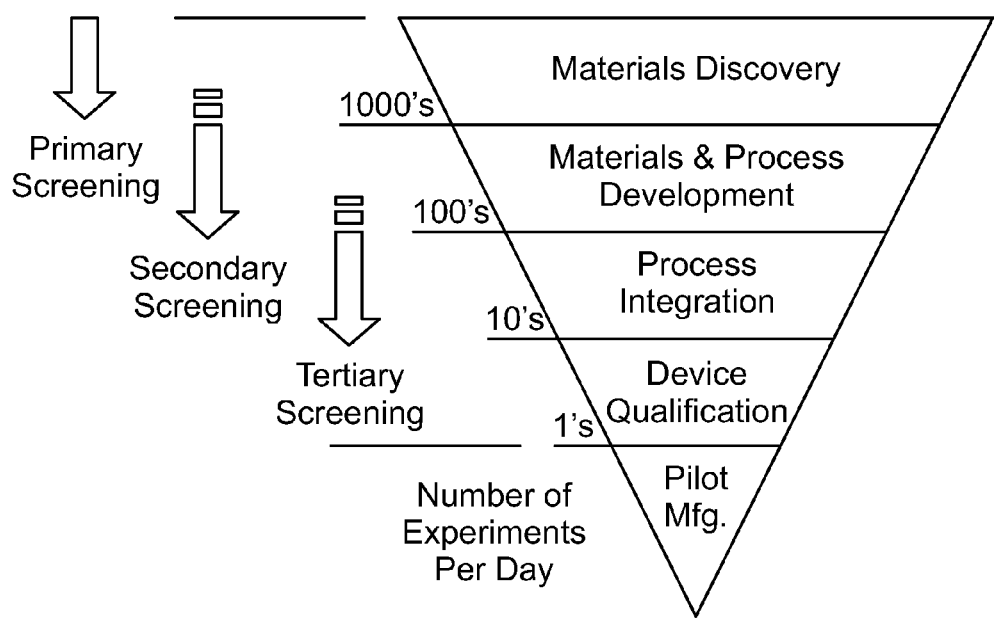
FIG. 12 is a simplified schematic diagram illustrating an overview of the High-Productivity Combinatorial (HPC) screening process for use in evaluating materials, unit processes, and process sequences for the manufacturing of semiconductor devices in accordance with one embodiment of the invention.

FIG. 12 is a simplified schematic diagram illustrating an overview of the High-Productivity Combinatorial (HPC) screening process for use in evaluating materials, unit processes, and process sequences for the manufacturing of semiconductor devices in accordance with one embodiment of the invention. As illustrated in FIG. 12, primary screening incorporates and focuses on materials discovery. Here, the materials may be screened for certain properties in order to select possible candidates for a next level of screening. In the initial primary screening there may be thousands of candidates which are subsequently reduced to hundreds of candidates. These hundreds of candidates can then be used or advanced to secondary screening processes which will look at materials and unit processes development. In the secondary screening level, process integration may be additionally considered to narrow the candidates from hundreds of candidates to tens of candidates. Thereafter, tertiary screening further narrows these candidates through process integration and device qualification in order to identify some best possible optimizations in terms of materials, unit processes and process sequence integration.

In one embodiment, the primary and secondary testing may occur on a coupon, while the tertiary testing is performed on a production size wafer. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels. With regard to the cleaning assembly described herein, the primary testing may involve experimentation on a coupon or substrate with multiple with multiple regions on the substrate being processed differently. The substrate may be cleaned through the ex-situ cleaning assembly described herein so that the most promising candidates can be determined. Thereafter, secondary screening may take the most promising candidates from the primary screening and perform further experiments. After the further experiment, the substrate is again cleaned through the ex-situ cleaning assembly described herein so that the most promising candidates can be further narrowed. This final set of most promising can be tested through tertiary combinatorial testing techniques cleaned through the ex-situ cleaning assembly described herein in order to evaluate the outcome of the tertiary testing.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

In the various screening levels, the process tools may be the same or may be different. For example, in dry processing the primary screening tool may be a combinatorial sputtering tool available described, for example, in U.S. Pat. No. 5,985,356. This tool is efficient at preparing multi-material samples in regions for simple materials properties analysis. For secondary and/or tertiary screening technique, a modified cluster tool may be retrofitted with a combinatorial chamber. As another example, in wet processing, the primary and secondary screening can be implemented in a combinatorial tool. The main differences here are not the capabilities of the tools, but the substrates used, the process variations or structures created and the testing done. For the tertiary tool, a wet reactor with combinatorial and non-combinatorial chambers described in U.S. application Ser. No. 11/647,881 filed Dec. 29, 2006, could be used for integrated and more sophisticated processing and analysis.

In the development or screening cycle, typically there are many materials synthesized or processed involving large permutations of a plurality of materials, a plurality of processes, a plurality of processing conditions, a plurality of material application sequences, a plurality of process integration sequences, and combinations thereof. Testing of these many materials may use a simple test, such as adhesion or resistivity and may involve a blanket wafer (or coupon) or one with basic test structures to enable testing for one or more desired properties of each material or unit process. Once the successful materials or unit processes have been selected, combinatorial techniques are applied to analyze these materials or processes within a larger picture. That is, the combinatorial techniques determine whether the selected materials or unit processes meet more stringent requirements during second stage testing. The processing and testing during the second stage may be more complex, e.g., using a patterned wafer or coupon, with more test structures, larger regions, more variations, more sophisticated testing, etc. For example, the structure defined by the material and unit process sequence can be tested for properties related or derived from the structure to be integrated into the commercial product.

This iterative process may continue with larger and more complex test circuits being used for testing different parameters. This approach serves to increase the productivity of the combinatorial screening process by maximizing the effective use of the substrate real estate, and optimizing the corresponding reactor and test circuit design with the level of sophistication required to answer the level of questions necessary per stage of screening. Complex reactors and/or test circuit designs are utilized at later stages of screening when desired properties of the materials, processing conditions, process sequence, etc. are substantially known and/or have been refined via prior stages of screening.

The subsections of test structures generated from previous testing for some screening levels may be incorporated into subsequent, more complex screening levels in order to further evaluate the effectiveness of process sequence integrations and to provide a check and correlation vehicle to the previous screen. It should be appreciated that this ability allows a developer to see how results of the subsequent process differed from the results of the previous process, i.e., take into account process interactions. In one example, materials compatibility may be used as a primary test vehicle in primary screening, then specific structures incorporating those materials (carried forward from the primary screen) are used for the secondary screening. As mentioned herein, the results of the secondary screening may be fed back into the primary screening also. Then, the number and variety of test structures is increased in tertiary screening along with the types of testing, for example, electrical testing may be added or device characterization may be tested to determine whether certain critical parameters are met. Of course, electrical testing is not reserved for tertiary testing as electrical testing may be performed at other screening stages. The critical parameters generally focus on the requirements necessary to integrate the structures created from the materials and process sequence into the commercial product, e.g., a die.

The above examples are provided for illustrative purposes and not meant to be limiting. The embodiments described herein may be applied to any process sequence to optimize the process sequence, as well as the materials, processes, and processing conditions utilized in the manufacture of a semiconductor device where there exist multiple options for the materials, processes, processing conditions, and process sequences.

The present invention provides greatly improved methods and apparatus for the differential processing of regions on a single substrate. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A cleaning chamber, comprising:
   a base portion housing a chuck;
   a lid affixed to the base portion;
   a support assembly linked to the lid, the support assembly including a top plate spaced apart from a bottom plate, the top plate having a plurality of openings defined therethrough and the bottom plate having a plurality of openings defined therethrough;
   a plurality of cups extending through corresponding aligned pairs of the plurality of openings of the top plate and the bottom plate, the plurality of cups configured to sealingly contact a surface of a substrate, wherein each cup of the plurality of cups is independently supported by the bottom plate via a disc disposed within each of the plurality of openings of the bottom plate,
   wherein the disc has a central opening which a body of the cup extends through and a plurality of additional openings configured to flexibly support the cup.

2. The cleaning chamber of claim 1 wherein the disc is configured to enable translation of the cup extending therethrough in three dimensions.

3. The cleaning chamber of claim 1, wherein the plurality of additional openings are a plurality of arc segments.

4. The cleaning chamber of claim 1, wherein a portion of the plurality of cups has a bottom surface defined along a plane that is below a plane defined by bottom surface of a remaining portion of the plurality of cups.

5. The cleaning chamber of claim 4, further comprising:
 a first manifold, a second manifold, and a third manifold, wherein each of the plurality of cups includes a centrally located channel extending from a top of a cup to a bottom of the cup, wherein the first manifold provides one of gas or vacuum to the portion of the plurality of cups through corresponding channels and wherein the second manifold and the third manifold provide gas to the remaining portion of the plurality of cups through corresponding channels.

\* \* \* \* \*